United States Patent
Rubin et al.

(10) Patent No.: US 7,359,648 B2
(45) Date of Patent: Apr. 15, 2008

(54) WAVELENGTH TUNING OPTIMIZATION OF SEMICONDUCTOR LASERS

(75) Inventors: Samuel Rubin, Rehovot (IL); Dan Sadot, Kfar Bilu (IL); Efraim Buimovich, Tel Aviv (IL)

(73) Assignee: Xlight Photonics Inc., Wilmington, DE (US)

( * ) Notice: Subject to any disclaimer, the term of this patent is extended or adjusted under 35 U.S.C. 154(b) by 759 days.

(21) Appl. No.: 10/416,349

(22) PCT Filed: Nov. 12, 2001

(86) PCT No.: PCT/IL01/01049

§ 371 (c)(1),
(2), (4) Date: Dec. 24, 2003

(87) PCT Pub. No.: WO02/39482

PCT Pub. Date: May 16, 2002

(65) Prior Publication Data
US 2004/0091008 A1    May 13, 2004

(30) Foreign Application Priority Data
Nov. 12, 2000  (IL) .................................. 139618

(51) Int. Cl.
H04B 10/04    (2006.01)
(52) U.S. Cl. .................. 398/182; 398/196; 398/197
(58) Field of Classification Search ......... 398/183–201
See application file for complete search history.

(56) References Cited

U.S. PATENT DOCUMENTS 5,438,444 A    8/1995    Tayonaka et al.
5,475,679 A   12/1995    Munter
5,499,135 A    3/1996    Heidemann et al.
5,621,893 A    4/1997    Joh
5,696,859 A   12/1997    Onaka et al.

(Continued)

FOREIGN PATENT DOCUMENTS

WO    WO 99/40654    8/1999

OTHER PUBLICATIONS

Sarlet et al., Novel mode stabilization scheme for widely tunable lasers, ECOC'99, Sep. 26-30, Nice, France.*

(Continued)

*Primary Examiner*—Dzung Tran
(74) *Attorney, Agent, or Firm*—Birch, Stewart, Kolasch & Birch, LLP

(57) ABSTRACT

A method of characterizing a tunable semiconductor laser diode by varying the laser tuning currents of a section, and measuring the output power transmitted by the laser through a wavelength discriminating device (WDD), in such a way that determines the currents needed to optimize the laser output within the passband of the WDD. A preferably employed method is to align the laser to the center of the passband, in order to maximize transmission. Since the laser alignment is performed relative to the spectral response curve of the WDD, there is no need to know the actual wavelength, either of the laser, or of the WDD. The WDD may be a multiplexer, a demultiplexer, an optical filter, or even a complete communications channel. The latter case thus constitutes a method of optimizing the performance of an optical communications channel by optimizing the wavelength of its laser source to the channel.

32 Claims, 14 Drawing Sheets

U.S. PATENT DOCUMENTS

| | | | |
|---|---|---|---|
| 6,018,536 A | | 1/2000 | Alphonse |
| 6,064,681 A | * | 5/2000 | Ackerman .................. 372/32 |
| 6,069,893 A | | 5/2000 | Parruck et al. |
| 6,081,539 A | | 6/2000 | Mattori et al. |
| 6,101,200 A | | 8/2000 | Burbidge et al. |
| 6,134,253 A | | 10/2000 | Munks et al. |
| 6,141,370 A | * | 10/2000 | Avrutsky et al. ............ 372/102 |
| 6,222,861 B1 | * | 4/2001 | Kuo et al. .................... 372/20 |
| 6,574,259 B1 | | 6/2003 | Fish et al. |
| 2002/0051472 A1 | | 5/2002 | Morthier |

OTHER PUBLICATIONS

"High Speed Intensity Modulation of 1.5 um DBR Lasrs with Wavelength Tuning", F. Kano, et al, IEEE Journal of Quantum Electronics 26 (1990) Aug. No. 8, pp. 1340-1346.

"Novel Mode Stabilisation Scheme for Widely Tunable Lasers", G. Sarlet, et al., ECOC'99, Sep. 1999, p. 178-179.

"An Accurate Technique for the Characterization of Wavelength Thermal Transients in Tunable DBR Laser", P. Gambini, et al, Dec. 1993, pp. 245-248.

* cited by examiner

FIG. 1
(PRIOR ART)
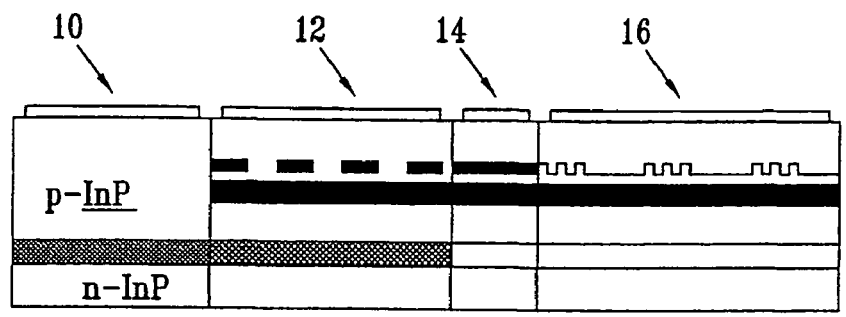
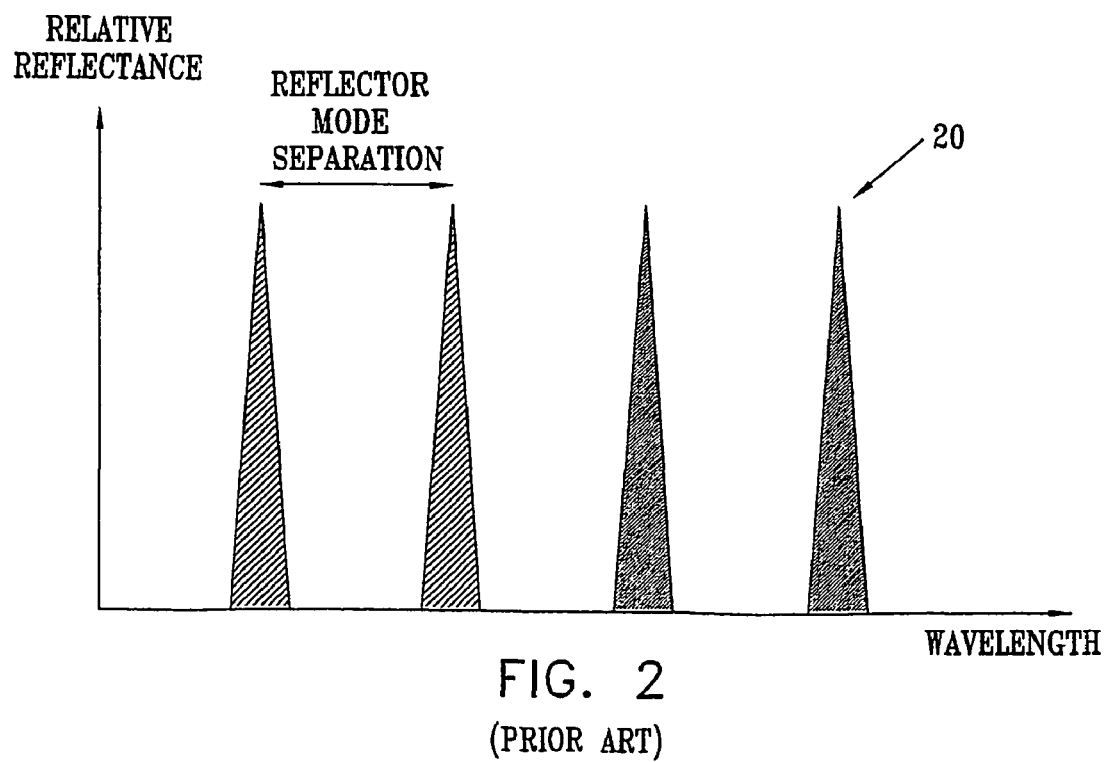
FIG. 2
(PRIOR ART)

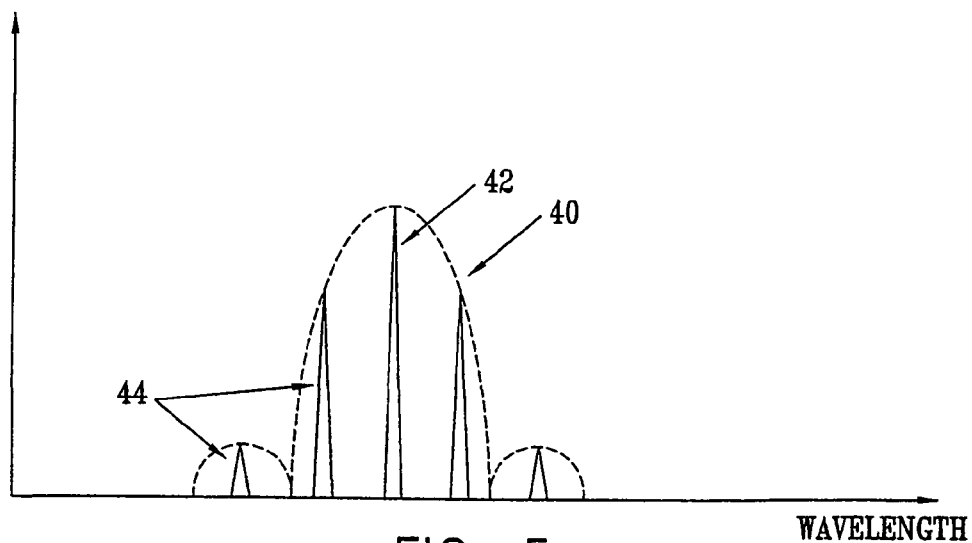
FIG. 5
(PRIOR ART)
FIG. 6
(PRIOR ART)
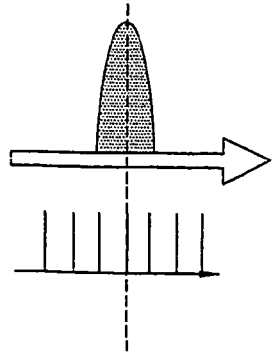

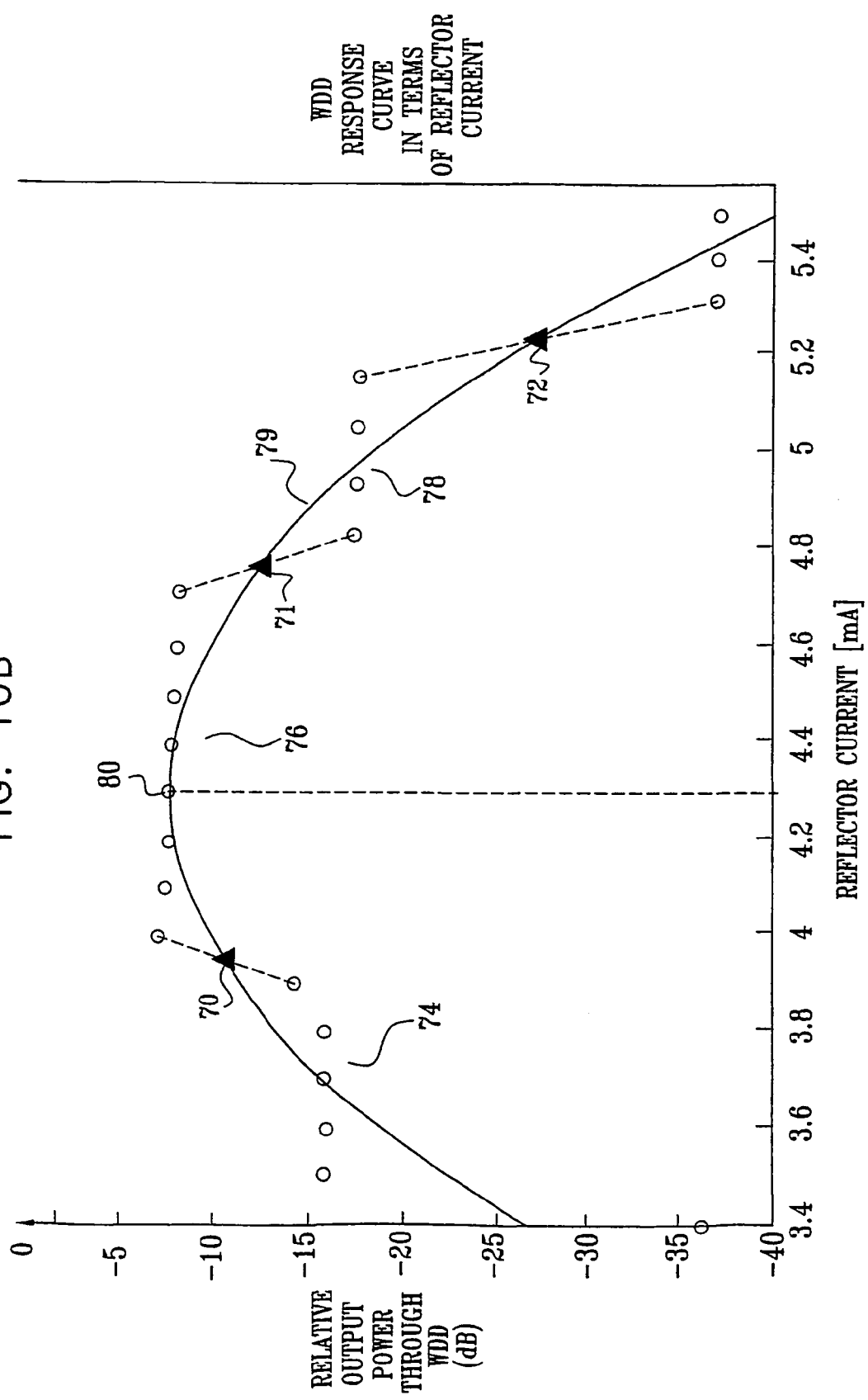

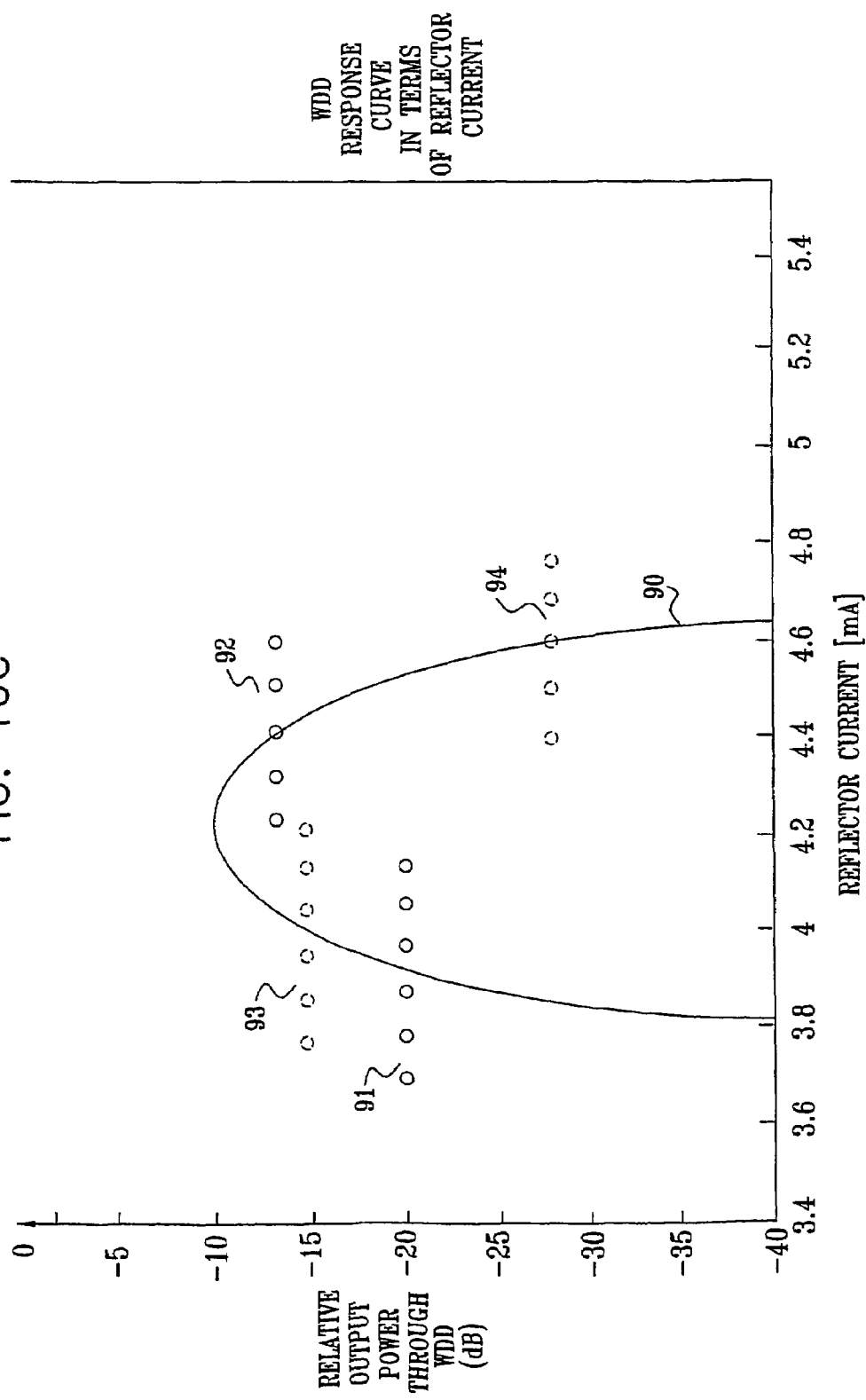

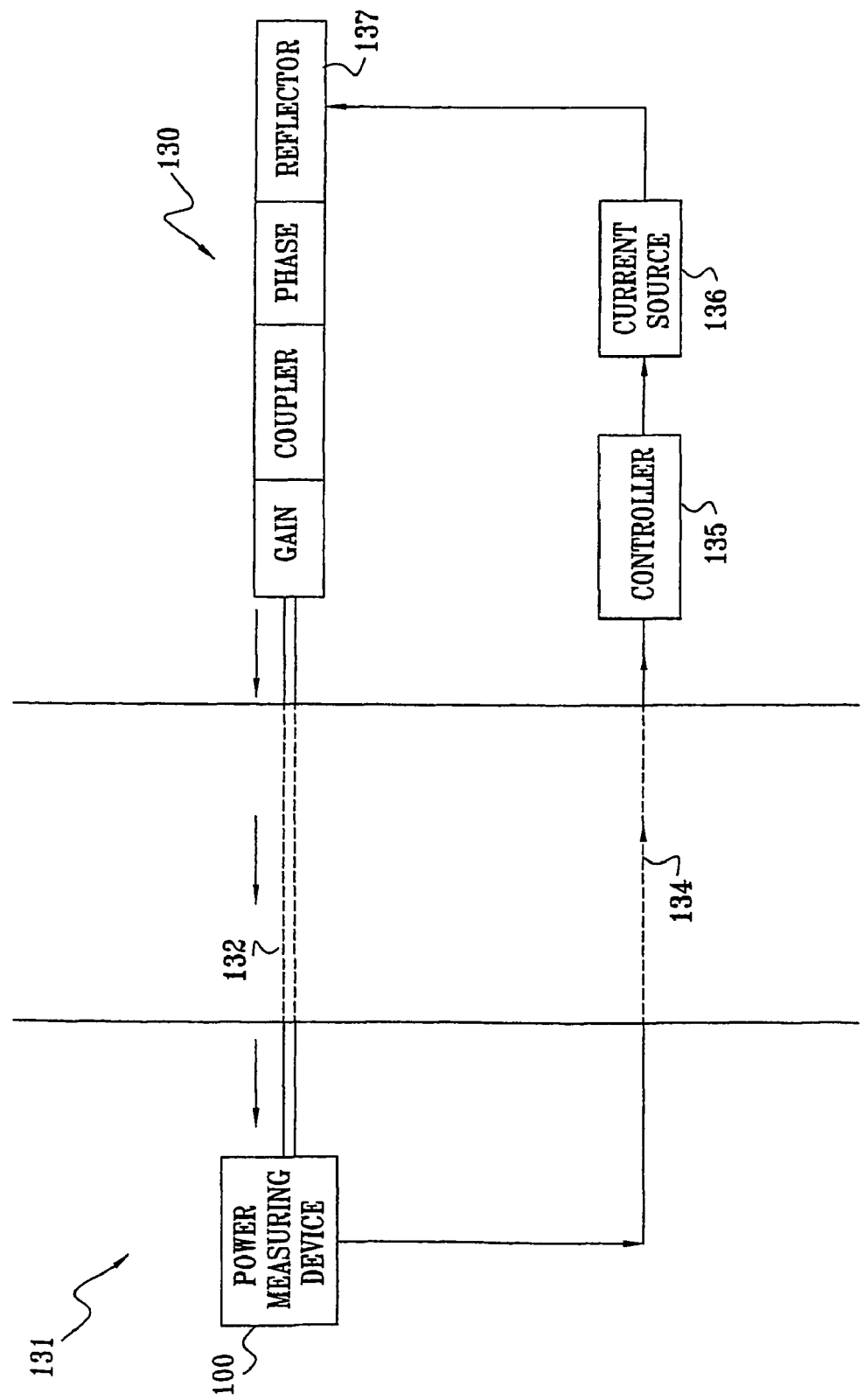

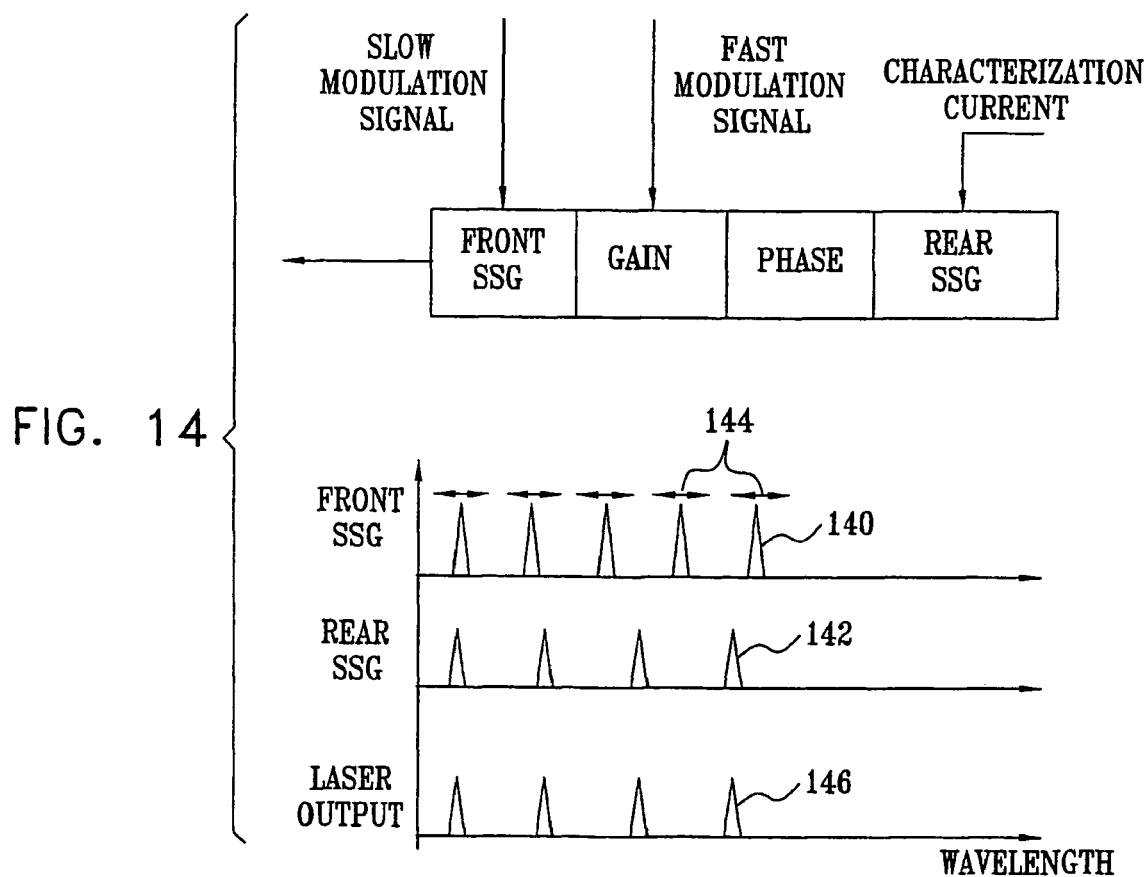

WAVELENGTH TUNING OPTIMIZATION OF SEMICONDUCTOR LASERS

FIELD OF THE INVENTION

This application is the national phase under 35 U.S.C. § 371 of PCT International Application No. PCT/IL01/01049 which has an International filing date of Nov. 12, 2001, which designated the United States of America.

The present invention relates to the field of tuning semiconductor laser diodes, especially methods of characterizing the currents required to optimize wavelengths of operation to those required by a telecommunications system.

BACKGROUND OF THE INVENTION

The increasing needs of telecommunications capacity requires the use of higher network bandwidths. Increasing the bandwidth in optical telecommunications systems is mainly performed by increasing the number of channels, and better utilization of the large bandwidth of optical fibers. Increasing the number of channels per fiber is achieved by assigning each channel a separate wavelength. This is known as Wavelength Division Multiplexing, or WDM. Such systems are typically composed of a large number of wavelength dependent components, starting with the laser transmitter source, continuing through optical amplifiers, wavelength selective elements or wavelength discriminating devices, such as filters, multiplexers and demultiplexers, and ending at the receivers. In order to properly utilize the large resources of such a system, proper optimization is necessary to avoid effects between channels such as crosstalk, and to optimize performance in terms of power budget. Because of the dense spectral utilization of such systems, wavelength optimization is one of the most important considerations of such a system. Mismatch between the intended wavelengths of transmitters in a system, for instance, will cause mutual interference with other transmitters, known as crosstalk, which will express itself in data loss and severe power penalties in the relevant channels in the system. Therefore, it is very important in such systems to ensure that transmission wavelengths are optimized with respect to the system requirements, and that methods are available to monitor this continuously during the lifetime of the system, without significantly interfering with system operation.

Furthermore, the total spectral response of the system depends on many wavelength sensitive components, and therefore the total system response is prone to variation, due both to initial component tolerance, and to component aging thereafter. Even though great effort may be made to standardize all systems to specific wavelengths, such as the ITU-T wavelength recommendations, since each optical system may be slightly different in its spectral response, this cannot always be simply achieved.

Tunable semiconductor laser diodes (TSLD's) are key components in the implementation of such optical communication systems, since it is necessary to provide the ability to dynamically allocate wavelengths in a WDM system by tuning the transmitter wavelength to the wavelengths of the target receivers. Lasers can emit at wavelengths that have a round trip phase change through the cavity from end to end of 2 k$\pi$ (k in an integer). These wavelengths define the Fabry-Perot modes of the cavity. In order to ensure single longitudinal mode operation of the laser, the net gain of the preferred lasing mode must be higher then that of the other Fabry-Perot modes. In a TSLD, cavity mode discrimination is achieved using wavelength selective structures such as reflectors, sampled reflectors (SG), super structure reflectors (SSG) and couplers.

The currently most widely used TSLD's use, as the tuning mechanism, the free plasma effect in these structures. By injecting current into these structures, a change in the optical refraction index is invoked, thus changing their optical properties and ultimately changing the wavelength of the laser. Such TSLD's provide fast tuning capabilities together with accuracy, stability and repeatability. The number of structures or sections in such a laser determines the number of input currents that have to be provided in order to tune the laser.

When the laser is correctly tuned, all of these sections provide the maximal transmission at the desired wavelength and attenuate other modes, thus ensuring single mode operation. If the laser is not correctly tuned, i.e. if the wavelength selective sections are not all aligned to a common wavelength, or the phase current is not adjusted to meet the required phase condition at the desired wavelength, the laser may operate in an unstable mode, or not operate at all. An arbitrary set of tuning currents usually results in no lasing power. This is why a multi-dimensional scan of the tuning currents, in an attempt to find a favorable combination, generally yields poor results.

Characterization of a tunable, multiple section semiconductor laser is generally understood in the art to mean a process in which the tuning currents necessary to tune the laser to given wavelengths are determined. The characterization procedure presents a problem in laser manufacture. This information cannot be determined during production, and is different for each individual laser due to microscopic differences between the lasers.

Current techniques for the characterization of multiple section lasers, such as DBR, SG-DBR, and GCSR lasers, use methods largely based on trial and error. A set of currents is introduced to the laser, and the wavelength and optical power are measured. The set is slightly changed and the process is repeated. As there are generally three or four different tuning currents, depending on the number of sections, this prior art process involves a three-dimensional or four-dimensional scan of the input currents to the laser. In this way the tuning currents for different wavelengths are obtained. This method is very time and labor consuming, currently taking several hours per laser, and adds significant additional costs to the laser. More recent developments of this basic method use what could be termed as intelligently directed trial and error methods, but the characterization procedure is still a time consuming and inefficient process, since it provides a large quantity of unneeded data for areas of operation that are not necessarily used in the application envisaged. Such characterization techniques generally focus on full characterization of the laser regardless of the area of its intended use.

A recent method of characterization is described in the PCT Patent Application by B. Broberg et al, for "Method of optimizing the operation points of lasers and means for carrying out the method", published as No. WO 99/40654 and hereby incorporated by reference in its entirety. A method is described therein whereby a sensing device attached to the laser output senses power discontinuities occurring at mode jumps of the laser, and calculates a series of mode planes of allowed operation away from these mode jumps. These mode planes are stored in a control system, which then ensures that the currents to each of the laser sections maintain operation of the laser on these mode planes. The outcome of the characterization described therein would appear, to the best understanding of the current applicants, to be another method for ensuring operation of the laser away from the well-known discontinuities occurring at mode jumps. Furthermore, although this method does reduce the magnitude of the characterization problem in comparison with previous methods, which characterize the laser even in forbidden areas of operation, the method still requires a large number of wavelength measurements to be performed within each mode plane, in order to relate operational points on the mode planes to actual wavelengths. These measurements methods, typically performed using an optical speck analyzer, are labor intensive and time-consuming. Furthermore, this approach does not seem to relate the wavelength characterization directly to the application in hand, but rather provides a cross reference between tuning currents and values of wavelength, which are then referred to those values of wavelength required by, or known from the application.

Another recent method of laser characterization is given in the article entitled "Novel mode stabilization scheme for widely tunable lasers" by G. Sarlet et al, published in the Proceedings of the European Conference on Optical Communications (ECOC) 1999, pp. 128-129, hereby incorporated by reference in its entirety. In this article, the authors describe a similar method of characterizing an SSG-DBR laser, in which a several scans are performed of the front SSG, rear SSG and phase section. In effect, three separate sets of two dimensional scans of two of the three sections are performed sequentially, thereby covering the entire operating envelope. This method too has the disadvantage of requiring many measurements, and is very time and labor intensive. Furthermore, it leads to the establishment of stable working points, but having no relation to the actual wavelength at the laser output. In order to relate to actual emitted wavelengths, an additional large number of measurements have to be performed, as in the previously mentioned prior art, using, for instance, an optical spectrum analyzer.

There therefore exists an urgent need for a method of precise characterization of TSLD's, which can be performed simply, speedily and at low cost, and preferably without special test equipment, and in particular, which optimizes the laser wavelengths to the requirements of the system in which it is used. Such a characterization would also assist in optimizing total performance of the system in terms of wavelength dependency of its components. The availability of such a method would enable more cost-effective, widespread use of these devices, and better utilization of available system wavelength resources.

The disclosures of each of the publications mentioned in this section and in other sections of the specification, are hereby incorporated by reference, each in its entirety.

SUMMARY OF THE INVENTION

The present invention seeks to provide a new method that enables fast and accurate characterization of TSLD's in comparison to prior art methods. The method differs from prior art methods in that the laser is not fully characterized with respect to all permissible areas of operation, but rather preferably only at points of stable operation of interest for the application on hand. In this respect, the term characterization is usually used in this specification, and claimed, having a more limited meaning than that generally used in the art, where it usually implies coverage of all permissible areas of operation of the laser, or even of all available areas of operation of the laser.

According to a preferred embodiment of the present invention, the laser tuning currents are varied and the output power transmitted by the laser through a wavelength selective element or a wavelength discriminating device (hereinafter a WDD) is measured, in such a way that determines the currents needed to optimize the laser within the passband of the WDD. A preferably employed embodiment is to align the laser to the center of the passband of the WDD, in order to maximize transmission therethrough. Since alignment of the laser, according to this method, is performed relative to the spectral response curve of the WDD, there is no need to know the actual wavelength, either of the laser, or of the WDD. The WDD may be a multiplexer, a demultiplexer, an optical filter, or a complete transmission channel of a telecommunications network, including a number of wavelength discriminating devices, all nominally tuned to the same wavelength, or any other optical transmission device having a response which varies as a function of wavelength. Throughout this application, such devices are generally referred to by the generic term "wavelength discrimination device", or WDD in short.

According to a first further preferred embodiment of the present invention, the method can be used to optimize the laser to operate most efficiently spectrally with the total telecommunication network in which it is being used, without the need to know the exact wavelengths of operation. According to a second further preferred embodiment of the present invention, even if the network degrades or changes over time, the method allows the laser to be adaptive to the changing needs of the network. According to a third further preferred embodiment of the present invention, if the WDD is chosen or tuned to a specific predefined wavelength, this method then allows the laser to be characterized with respect to that same predefined wavelength, and this is therefore a method of characterizing the laser at a predefined wavelength. According to a fourth further preferred embodiment of the present invention, the use of an array of WDD's, such as a WDM demultiplexer, enables the laser to be fully wavelength characterized at all the wavelengths of the WDD array. Since according to the above-described preferred methods, the characterization is matched to the desired wavelengths of interest, the characterization procedure is simplified and significantly shortened, in that full characterization of the laser, including regions of no interest, is no longer needed.

There is thus provided, in accordance with a preferred embodiment of the present invention, a method whereby the current to a particular section is varied in such a way that the response of that particular section can be determined by measuring the output power transmitted through a WDD. In this way, it is possible to determine the current needed by that section in order to optimize the laser spectral output relative to the spectral response of the WDD.

According to another preferred embodiment of this invention, one or more of the wavelength selective sections of the laser can be current modulated during the measurement and characterization of another section, in order to remove the influence of the modulated sections on the spectral output of the laser, as described in co-pending Israel Patent Application No. 137732, by the present Applicant.

In accordance with yet another preferred embodiment of the present invention, there is provided a method of characterizing a tunable semiconductor. laser diode, consisting of the steps of passing at least part of the output power of the laser through a wavelength discriminating device, adjusting the tuning current of at least one section of the laser, and performing measurements of the transmission of the output power through the wavelength discriminating device as a function of the tuning current.

There is further provided in accordance with yet another preferred embodiments of the present invention, the characterizing mentioned above is performed relative to the wavelength discriminating device. Furthermore, the measurements may preferably be used to calculate a tuning current for characterizing the section of the laser.

In accordance with still another preferred embodiment of the present invention, in any of the methods mentioned hereinabove, the tuning current may be such that the wavelength of the section is optimized within the passband of the wavelength discriminating device. Furthermore, the optimization can essentially consist of the centering of the wavelength within the passband or alternatively of the aligning of the wavelength to a predefined position within the passband.

In accordance with further preferred embodiments of the present invention, in the methods described above, the output power as a function of the tuning current may have the form of a plurality of steps, and the calculation may consist of the steps of determining the center points of at least two of the steps in the measured output power, fitting a curve having properties similar to that of the wavelength response of the wavelength discriminating device through the center points of the steps, and determining the tuning current of the section at a predetermined point of the fitted curve. The predetermined point may preferably consist of essentially the maximum of the curve. Furthermore, the at least two steps mentioned above may be three steps.

Alternatively and preferably the calculation may consist of the steps of determining the center points of at least two of the edges between the steps in the measured output power, fitting a curve having properties similar to that of the wavelength response of the wavelength discriminating device through the center points of the edges, and determining the tuning current of the section at a predetermined point of the fitted curve. The predetermined point may preferably consist of essentially the maximum of the curve. Furthermore, the at least two edges mentioned above may be three edges.

There is provided in accordance with yet a further preferred embodiment of the present invention, the method as described above, and wherein the fitting of the curve is performed by means of a least squared error optimization. The curve may preferably have a parabolic form.

There is even further provided in accordance with another preferred embodiment of the present invention, a method as described above, and wherein the section of the laser is a wavelength selective section of the laser. This wavelength selective section may preferably be a reflector section.

Furthermore, in accordance with yet another preferred embodiment of the present invention, there is provided a method as described above, and also consisting of the subsequent step of adjusting the current to a phase section of the laser, to optimize the transmission of the output power through the wavelength discriminating device. In any of the preferred methods described above, the center wavelength of the wavelength discriminating device may be known or unknown.

In accordance with further preferred embodiments of the present invention, the wavelength discriminating device may be an optical filter, an optical multiplexer, an optical demultiplexer, or an optical communication channel.

Furthermore, the measurements may preferably be utilized to optimize power budget in the optical communication channel, or to minimize crosstalk between the optical communication channel, and an adjacent optical communication channel.

In accordance with a further preferred embodiment of the present invention, the measurements mentioned above may be utilized to optimize transmission of laser power through the wavelength discriminating device.

In accordance with yet more preferred embodiments of the present invention, in any of the methods mentioned above, the laser may be a GCSR laser, a SSG-DBR laser, or a DBR laser. Furthermore, the wavelength of the output of the laser need not be known.

In accordance with still another preferred embodiment of the present invention, there is provided a method of optimizing the performance of an optical communication channel, the channel including a tunable semiconductor laser diode, and having a variable wavelength characteristic, by optimizing the tuning current of at least one section of the laser to the channel.

There is further provided in accordance with still another preferred embodiment of the present invention, a method of optimizing the performance of an optical communication channel, the channel including a tunable semiconductor laser diode and having an unknown wavelength characteristic, by optimizing the tuning current of at least one section of the laser to the channel.

In accordance with a further preferred embodiment of the present invention, there is also provided a method of maintaining the performance of an optical communications system including a tunable semiconductor laser diode, consisting of the steps of monitoring an output power of a wavelength discriminating device within the system, and recalibrating the laser to match the wavelength discriminating device when a reduction of the output power is noted. Preferably and alternatively, the recalibration may be performed at predetermined intervals.

There is provided in accordance with yet a further preferred embodiment of the present invention, a method of optimizing the performance of an optical communications channel including a tunable semiconductor laser diode transmitter and a receiver, by matching the wavelength of the laser diode for use with the channel, and consisting of the steps of transmitting a signal from the laser diode through the channel, monitoring the signal detected by the receiver of the channel, adjusting the tuning current of at least one section of the laser diode, performing measurements of the transmission of the output power through the channel as a function of the tuning current, and calculating from the measurements a tuning current for optimizing the section of the laser for transmission through the channel. According to this method, the wavelength of the laser preferably need not be known.

There is even further provided in accordance with a preferred embodiment of the present invention an apparatus for characterizing a tunable semiconductor laser diode the laser having an output and at least one section for tuning the wavelength of the output of the laser, consisting of a wavelength discriminating device having at least one output connected to the output of the laser, a current source supplying tuning current to at least one section of the laser, a power measuring device connected to at least one output of the wavelength discriminating device, the power measuring device providing signals dependent on the powers transmitted by the wavelength discriminating device as a function of the tuning current, and a computer, wherein the computer receives the signal from the power measuring device, and calculates from the signal, the current necessary to tune the section of the laser, such that the laser output is aligned at a predetermined spectral position relative to the passband of the wavelength discriminating device.

BRIEF DESCRIPTION OF THE DRAWINGS

The present invention will be understood and appreciated more fully from the following detailed description, taken in conjunction with the drawings in which:

FIG. 1 is a schematic illustration of a prior art TSLD, showing the constituent sections operative in determining the lasing wavelength of the device;

FIG. 2 is a schematic graph of the relative reflectance of the Bragg grating section of the laser shown in FIG. 1, as a function of wavelength;

FIG. 5 is a schematic plot of the combined spectral response of the reflector and coupler sections of the laser shown in FIG. 1, which determines the overall cavity gain spectrum;

FIG. 6 is a schematic representation of the wavelength alignment needed between the various sections of the laser shown in FIG. 1, in order to correctly tune the laser to a required wavelength;

FIG. 10B is a graph showing how, according to another preferred embodiment, an estimation can be made of the current needed in order to tune the reflector to the peak wavelength of the wavelength discriminating device;

FIG. 10C is a graph showing how, according to yet another preferred embodiment, the methods illustrated by the results in FIGS. 10A and 10B can be executed even with a narrow response curve WDD, by measuring several steps in the output power of the WDD by varying the phase section current also;

FIG. 12 is a schematic block diagram of an optical telecommunications channel utilizing a method, according to a further preferred embodiment of the present invention, of characterizing a laser transmitter driving the channel, to provide optimum transmission with respect to the installed components of the telecom channel;

FIG. 14 is schematic wavelength plot of the manner in which an SSG-DBR laser is characterized using modulation to the one of the reflector sections of the laser, according to another preferred embodiment of the present invention.

DETAILED DESCRIPTION OF PREFERRED EMBODIMENTS

Reference is now made to FIG. 1, which illustrates schematically the structure of a prior art TSLD, showing the constituent sections operative in determining the lasing wavelength of the device. The TSLD shown is known as a Grating Coupler Sampled Reflector laser, or a GCSR laser.

The GCSR laser has four sections, a Gain section 10, a Sampled Reflector 16, a Coupler 12, and the Phase section 14. These sections function in the following manner:

In the gain section 10, the generation and amplification of photons takes place. The current to this section is the pump current for the laser, and is part of the tuning mechanism.

A Sampled Reflector 16, is placed at one end of the resonator, instead of the mirror used in a conventional laser cavity. Unlike a mirror, the SR which is a sampled Bragg grating, reflects a comb of wavelengths back to the resonator, as is depicted in FIG. 2. The spacing of the comb 20 in the example shown is typically 4 nm for a laser operating in the wavelength range around 1500 nm. The width of one tooth of the comb is a fraction of this. The total wavelength span of the reflector is about 100 nm.

Figure 3:
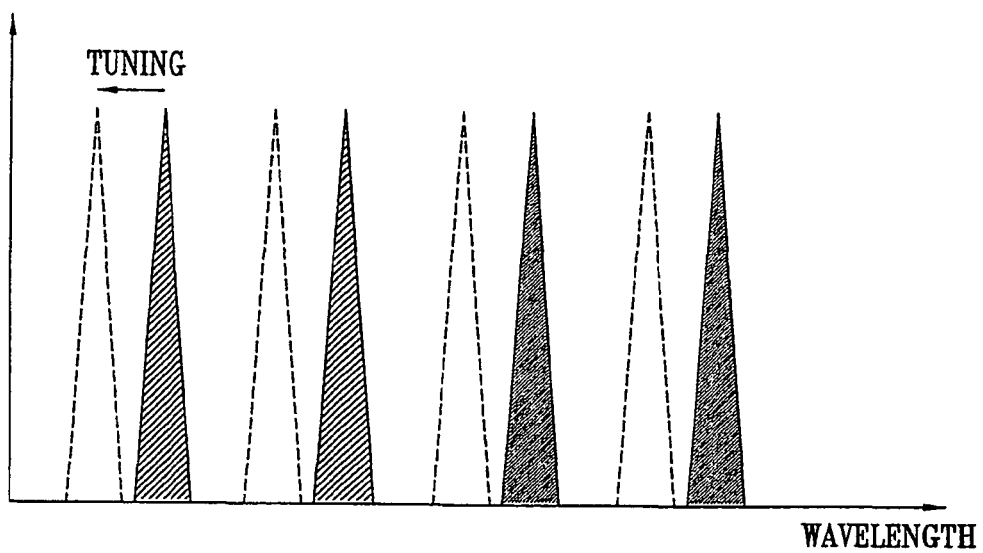
FIG. 3 is a schematic illustration of how the reflection peaks of the grating response shown in FIG. 2 shift in wavelength with change in tuning current.

When a tuning current is applied to the reflector, all of the reflector modes shift to shorter wavelengths by an amount approximately proportional to the current, as shown in FIG. 3.

Figure 4:
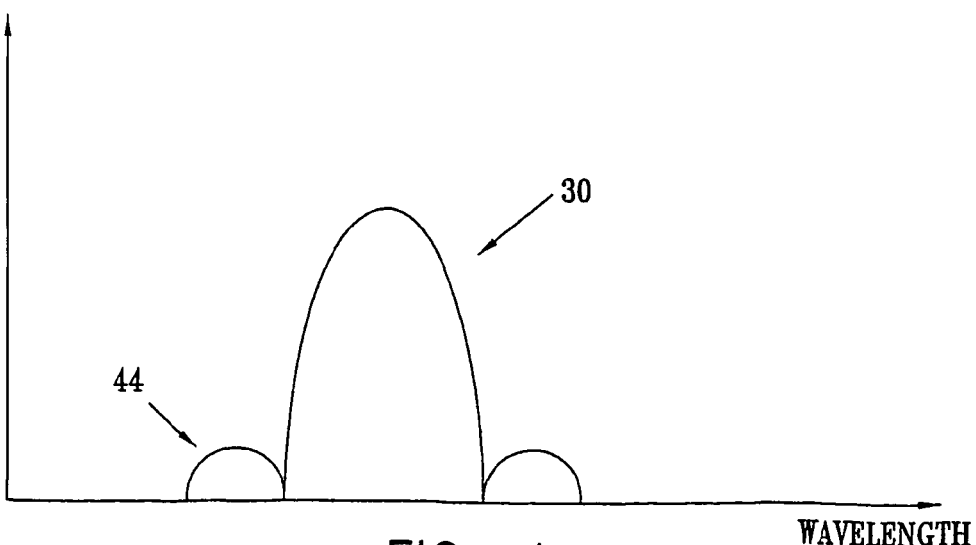
FIG. 4 is a schematic plot of the relative transmittance of the coupler section of the laser shown in FIG. 1.

Returning to the structure of the GCSR laser, the third section, the Coupler 12, acts as a band pass optical filter inside the laser. The bandwidth of the coupler is typically about 10 nm. This section is used to filter out one of the reflector modes. FIG. 4 shows the spectral response of the coupler. The dominant mode 30, monopolizes almost all of the cavity gain, such that the side modes 44 are effectively suppressed and hence very small.

The coupler too can be current tuned to fit its peak response to a specific wavelength. FIG. 5 is a plot showing how the combined spectral response of the reflector 42 and the coupler 40 is the product of the individual spectral responses.

Tuning the GCSR laser to a specific wavelength is performed by providing the maximum gain at that wavelength and maximum attenuation at other wavelengths. The spectral response of the SR and GC can be shifted on the wavelength axis simply by injecting current into those sections of the laser. The currents injected to the SR and GC align their response to the required wavelength.

Since the required wavelength is arbitrary with respect to the laser structure, it is not likely that it will satisfy the phase condition i.e. coincide with a Fabry-Perot mode. In order to ensure that this condition is fulfilled, the phase section is used. This section is a simple waveguide. Its optical length is adjusted electrically in order to satisfy the phase condition of a required wavelength. The adjustment is made by injecting current into this section. If the phase is not adjusted properly, and the Fabry-Perot mode is not exactly at the same wavelength as that to which the coupler and reflector are adjusted, then the laser may radiate at the Fabry-Perot mode closest to that wavelength, but with reduced efficiency.

Reference is now made to FIG. 6 which shows the wavelengths of the reflector, the coupler and a Fabry-Perot mode of the GCSR laser shown in FIG. 1, all lined up at the desired wavelength. When this condition has been achieved, the laser emits with maximum efficiency at that particular wavelength.

Figure 7:
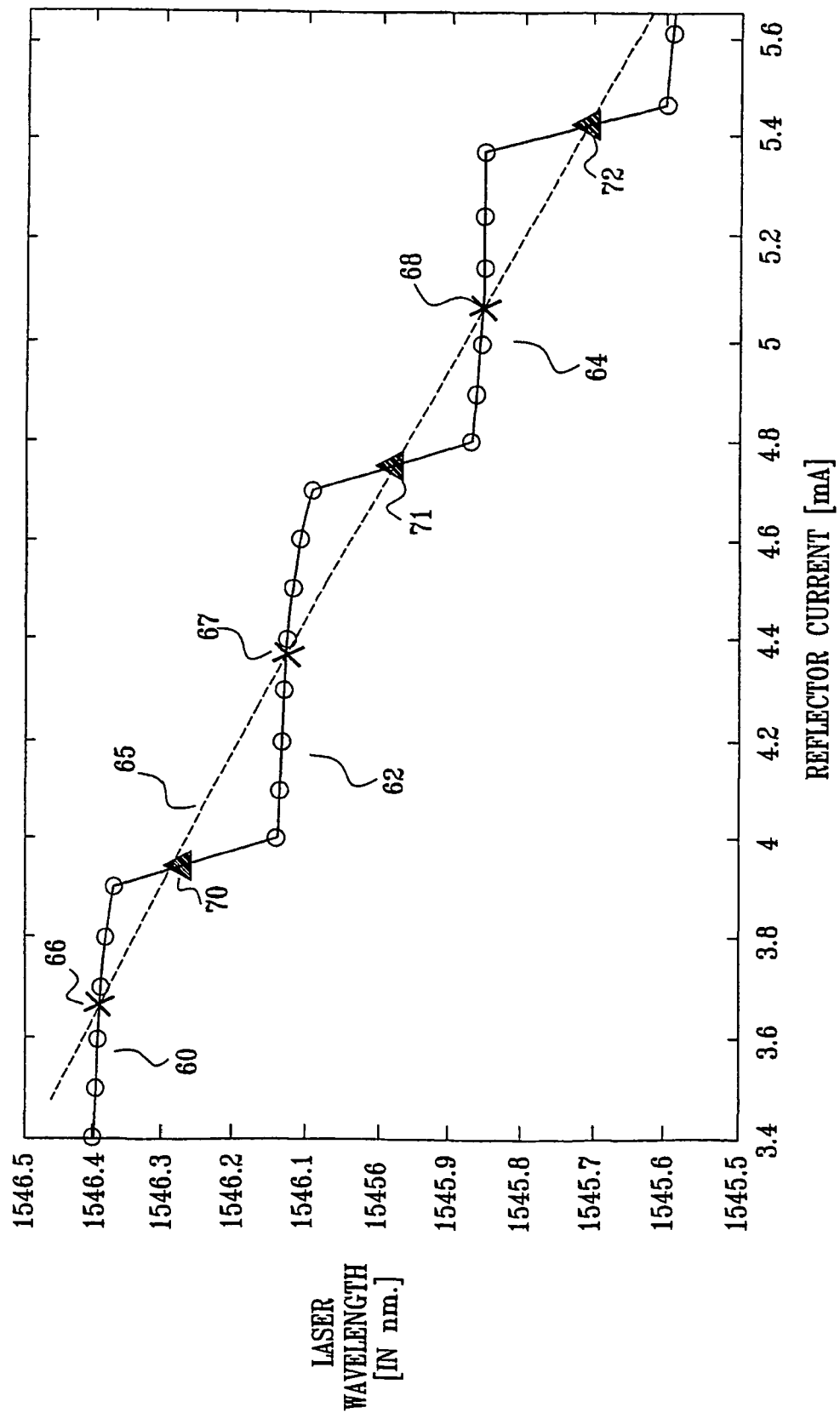
FIG. 7 is a is a schematic plot obtained of the measured wavelength at the laser output as a function of the reflector current of the laser shown in FIG. 1.

Reference is now made to FIG. 7, which shows a plot of the wavelength at the output of the laser as a function of the reflector current, as is known in the prior art. Although the peak wavelength of the reflector can be continuously tuned with change of current, the laser output itself cannot follow this change directly, but is always constrained to one of the wavelengths allowed by a Fabry-Perot mode. These allowed wavelengths are seen in FIG. 7 as steps 60, 62, 64, of approximately constant wavelength, each corresponding to a consecutive Fabry-Perot mode. Between each of these steps, the lasing wavelength undergoes an abrupt change, corresponding to the mode jumps, well-known in the art.

An approximation of the peak reflector wavelength as a function of reflector current can be obtained by extrapolating a straight line 65 through the centers 66, 67, 68 of these lasing steps. The approximation of straight line behavior is applicable for a small tuning range of several steps only, by assuming that the peak reflector wavelength has a linear tuning behavior in this range. Alternatively, the straight line can be extrapolated through the center points 70, 71, 72, of the edges between the steps of the lasing wavelengths. By means of either of these methods, an approximate curve of the reflector wavelength as a function of the reflector peak current is thus obtained, as shown by the dotted line 65 in FIG. 7. Beyond the range of a few steps, the relationship between reflector current and reflector peak wavelength may depart from true linearity. For this reason, the characterization method to be described below is only of maximum accuracy over the typical ranges shown, but since the typical spectral width of a single communication channel, and accordingly the spectral width of a typical WDD, does not exceed this wavelength range, this practically barely limits the usefulness of the method.

Figure 8:
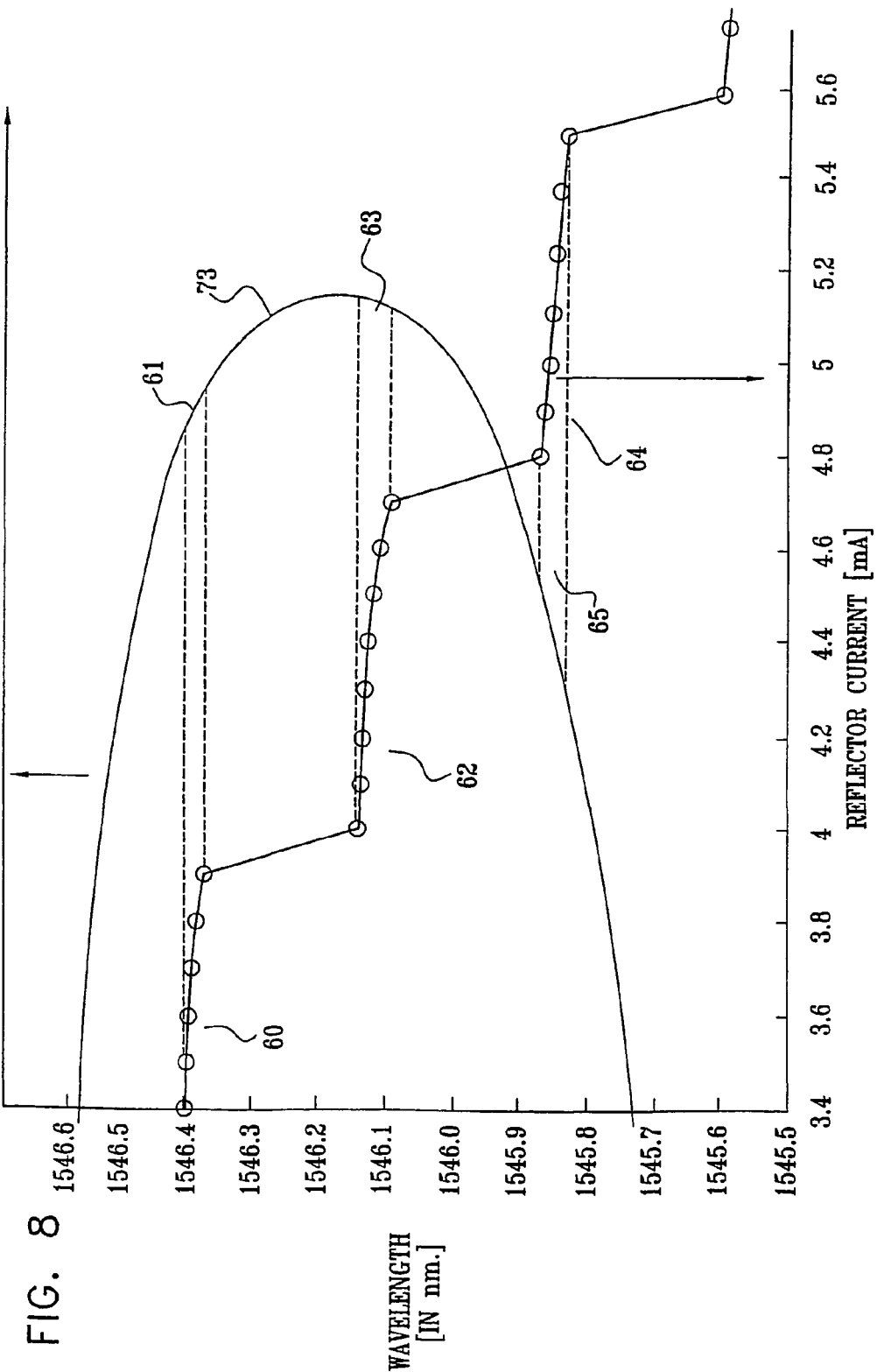
FIG. 8 is a plot of the transmission response of a wavelength discriminator device, using the same wavelength ordinate as that of FIG. 7, showing the spectral relationship between the reflector current of the laser and the WDD response.

Reference is now made to FIG. 8, which is a schematic plot showing the transmission response curve 73 of a WDD that can be connected to the output of the laser, as a function of wavelength, plotted using the same wavelength ordinate as the graph of laser reflector current versus wavelength shown in FIG. 7. According to the method of this preferred embodiment of the present invention, the reflector current required to tune the reflector to the center of the WDD passband is determined, but without needing to know the exact wavelength at the center of this passband. The method can also be used in a similar manner to tune the reflector to any other predetermined position within the passband, without needing to know the exact wavelength at that predetermined position. This procedure is performed in spite of the fact that there is no direct one-to-one relationship between the tuning current of the reflector and the actual output of the laser, since the true relationship is masked by the Fabry-Perot mode jumps of the laser output. The data from FIG. 7 representing the wavelength at the output of the laser as a function of the reflector current is also plotted in FIG. 8, showing how the data in FIG. 8 can be used for determining the resulting power transmission of the laser output through the WDD as a function of wavelength. Thus, for example, the points on step 60 result in a relative power transmission through the WDD, as determined from the level of the WDD response curve at section 61, and likewise for step 62 at section 63 and for step 64 at section 65.

The WDD shown in the preferred embodiment of FIG. 8 has a symmetrical parabolic shape with respect to the center of its passband. It is to be understood, however, that other shaped WDD's can also preferably be used in the method of this invention, and even unsymmetrical shapes, so long as the characteristics of the shape is known in advance. Thus, the method can be used, for instance, for characterizing a laser with respect to a WDD with Gaussian or Lorenztian characteristics, or even skewed versions thereof.

Figure 9:
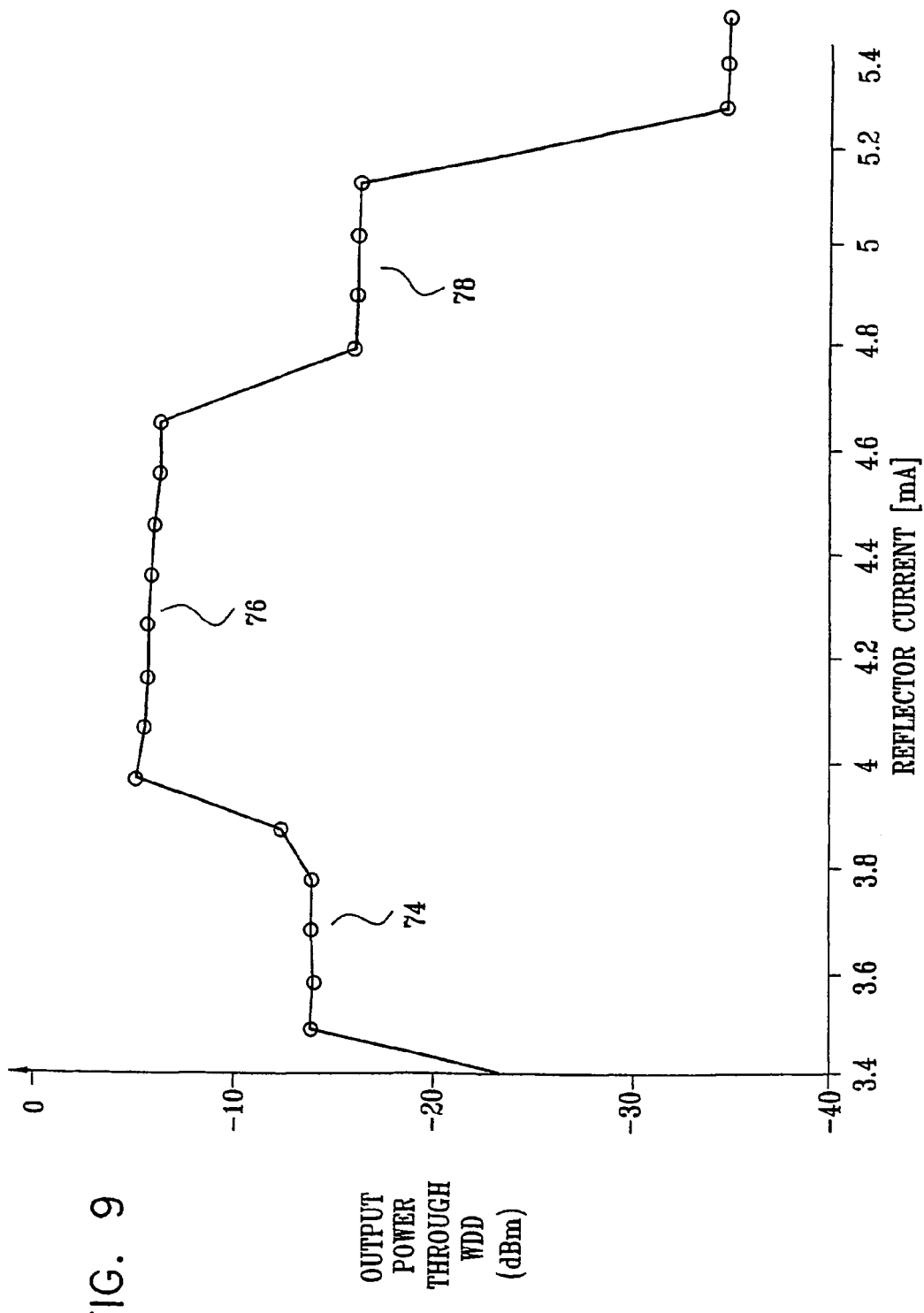
FIG. 9 is a plot of the power transmitted by the laser of FIG. 1, through a wavelength discriminator device, as a function of the reflector current of the laser.

Since the power output through the WDD is a function of the response curve of the WDD as well as the laser output power and wavelength, the observed steps in wavelength at the laser output shown in FIG. 7 are mirrored as corresponding steps in the power output transmitted through the WDD. This is shown in FIG. 9, which shows the power transmitted through the WDD as a function of the reflector current of the laser. The results plotted in FIGS. 8 and 9 are not necessarily from the same experimental plot, and therefore, though similar to real results, they should be taken as being schematic to illustrate the method, rather than an example from which measurements can be taken.

As the current increases from approximately 3.5 mA, the transmitted power remains more or less constant 74, corresponding to the fact that the wavelength shown in FIGS. 7 and 8 remains approximately constant at the value given on step 60. This power level is defined by the points on the section marked 61 of the WDD response curve. As the current rises above approximately 3.9 mA, a mode jump occurs and the power transmitted increases stepwise by approximately 8 dB, corresponding to the change in wavelength shown in FIGS. 7 and 8 from its value on step 60 to that on step 62. The transmitted power through the WDD then remains approximately constant 76 as the reflector current continues to increase, corresponding to the approximately constant wavelength shown in step 62 in FIGS. 7 and 8. That power level is defined by the points on the section marked 63 of the WDD response curve. Between approximately 4.7 mA and 4.9 mA, a further mode jump occurs, and the power drops about 10 dB to level 78, corresponding to the wavelengths of step 64 in FIGS. 7 and 8. That power level is defined by the points on the section marked 65 of the WDD response curve. Just above 5.2 mA, another mode jump causes the power transmitted to drop drastically, as the corresponding wavelength of the next mode step falls outside of the WDD passband shown in the example illustrated in the embodiment of FIG. 9.

Figure 10A:
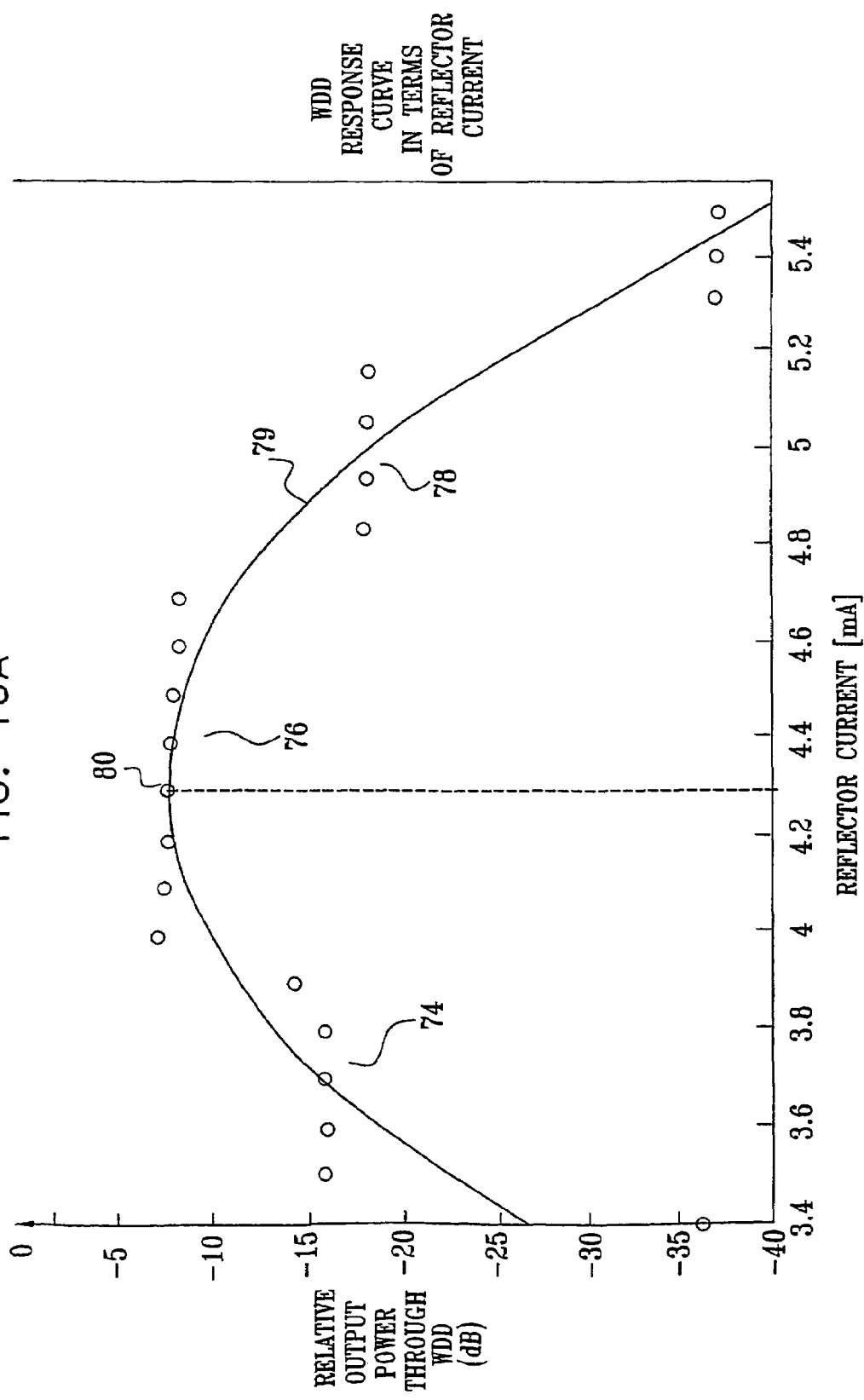
FIG. 10A is a graph showing how an estimation can be made of the current needed in order to tune the reflector to the peak wavelength of the wavelength discriminating device, according to a preferred embodiment.

Reference is now made to FIG. 10A, which illustrates how the positions of the steps 74, 76, 78, in the power transmitted through the WDD can be used to determine the reflector current required to bring the peak reflector wavelength to the position of the center of the passband of the WDD, thereby optimizing the reflector tuned wavelength to the WDD. FIG. 10A has two ordinate scales. The left hand ordinate is used to repeat the plot of the data in FIG. 9, where the relative power transmitted from the laser through the WDD is plotted as a function of the reflector current. The right hand ordinate is used to show the spectral response shape 79 of the WDD as a function of the reflector current of the laser. This functional dependence can be assumed because of the known linear relationship between the wavelength and the peak reflector current, as can be seen in FIG. 8.

The determination method can be graphically viewed as overlaying a curve having the same characteristics as those of the WDD passband response curve, onto the plot of the transmitted power through the WDD, and adjusting the mutual position of the curves, both along the reflector current axis and the power axis, until the measured center points of the various stepped levels of transmitted power through the WDD provide the best possible match to the assumed WDD response curve. This fit may preferably be performed by any of the methods known in the art, for instance by minimization of the least-squares error. When this position is reached, the laser reflector current is known to be optimized such that the reflector peak wavelength is matched to the center of the passband of the WDD. This reflector current can then be stored as an optimized reflector current for operation of the laser with that WDD.

In the example shown in FIG. 10A, when this curve matching procedure is graphically performed, it is observed that since the center point of step 74 is higher than the center point of step 78, the peak of the WDD response is not symmetrically located with respect to those two center points, but is located at lower reflector currents. In the example shown, the maximum of the passband of the WDD 80 appears to be at approximately 4.3 mA, i.e. slightly to the left of the center of step 76.

A preferred mathematical way of performing this procedure is by means of a making a best fit approximation of a curve, such as a parabola, having predefined characteristics representative of the WDD, to the center points of the transmitted power steps measured at the output of the WDD, thereby providing the estimated WDD response curve as a function of measured reflector current. If this calculation is performed to second order, this curve can indeed be considered to approximate a parabola, and hence it may be estimated from just three measurements, such as the center points of steps 74, 76 and 78. In the example of the fit shown in FIG. 10A, the current needed to tune the reflector to the peak of the WDD response can be seen to be approximately 4.3 mA.

The above embodiments have been described in terms of fitting the WDD response curve to the centers of the wavelength steps 60, 62, 64 of FIG. 7, which correspond to the center points of steps 74, 76 and 78 of FIG. 10A. According to another preferred embodiment of the present invention, the center points, 70, 71 and 72, of the edges between the steps of the lasing wavelengths shown in FIG. 7 may be used to define the reflector currents for matching to the WDD response curve. A graph illustrating this embodiment is shown in FIG. 10B, where the center points 70, 71 and 72 are shown.

The graphs for the preferred methods shown in FIGS. 10A and 10B illustrate the matching of three steps to the response curve of the WDD. Sometimes, the passband of the WDD being used is narrow, such that only two power level steps would be contained within the passband. Since two points are insufficient to define a general parabolic curve, an alternative method is required in order to provide sufficient data points for the curve fitting process. A preferred method for accomplishing this is shown in FIG. 10C, which is a schematic illustration of a graph showing results that may be obtained With a WDD response curve 90 so narrow that only two transmitted power steps 91, 92, fall within the passband of the WDD. Once the position of these steps have been recorded, the phase section current to the laser is changed to a different value, thus obtaining a new pair of steps 93, 94, for the new phase current chosen. In this manner, the number of points obtained for fitting the response curve to the power transmission data is increased to more than the required minimum of three points.

The greater the number of different phase current settings chosen, the greater the number of sets of steps are obtained. This method can thus also be used when three steps are available within the WDD passband, but when a higher level of accuracy is desired for matching the response curve to the data, by using a polynomial of higher degree, in order to obtain a more accurate representation of the curve.

It is clear however, that according to any of these preferred methods, the laser reflector current can be optimized to the WDD merely by a small number of passband measurements. As previously mentioned, if the WDD is not symmetrical, this can be taken into account in the best fit procedure, as long as the characteristics of the unsymmetrical response curve are known.

It should be noted that the measurement sensitivity of the characterization method according to the various preferred embodiments of the present invention, using wavelength discrimination, can be significantly higher than prior art methods which use amplitude discrimination. The method is thus simpler to perform than such prior art amplitude discrimination methods, and should also be more accurate. Thus, for example, in the embodiment according to the present invention, represented by the results shown in FIG. 9, the detected changes in power used in order to perform the characterization process are of the order of several dB, and even more. With a broader response WDD, the sensitivity will be correspondingly less, but still typically a number of dB. In contrast, according to the prior art method described in WO 99/40654, as apparent for instance from FIG. 6 of that publication, amplitude changes of the order of 0.2 dB need to be detected in order to determine the functional relation between changes in output power and section current. It is these functions which define the sought-after mode planes of that method. Such small changes are generally only slightly above the noise level of the measurements, thus complicating and limiting the accuracy of the measurements.

Figure 11:
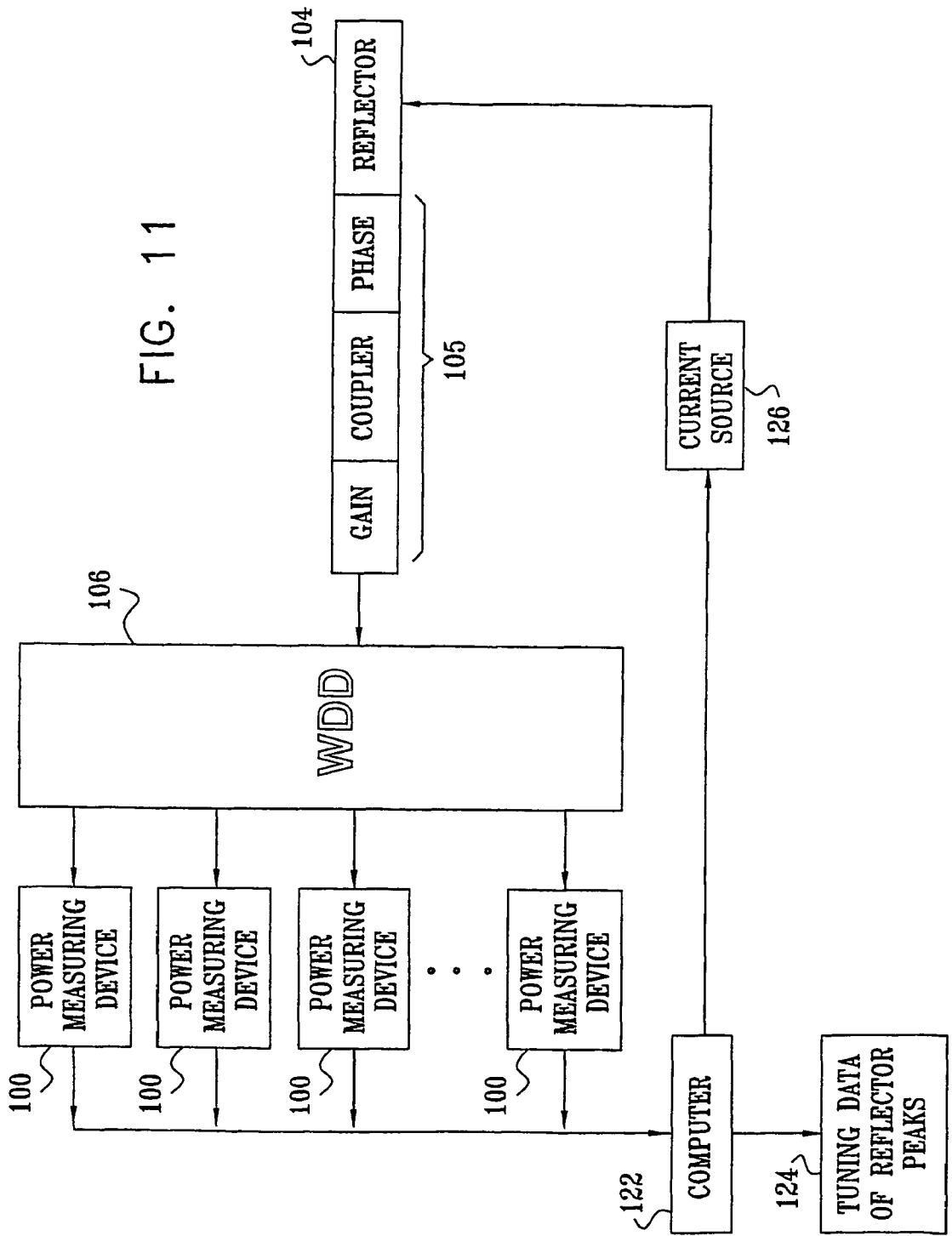
FIG. 11 is a schematic block diagram of an apparatus for experimentally performing a full reflector characterization scan, using an external array of wavelength discriminating devices, according to another preferred embodiment of the present invention.

Reference is now made to FIG. 11, which is a schematic block diagram of an apparatus according to another preferred embodiment of the present invention, for performing a procedure whereby the reflector current of a GCSR tunable laser 105 is optimized to match the center of the passband of a WDD, according to a method of a previously mentioned preferred embodiment of the present invention. A current source 126, preferably controlled by a computer 122, supplies the laser reflector 104 with current at a series of predetermined levels. The output of the laser is passed through a WDD 106, shown in FIG. 11 with multiple outputs, as is typical of a real-life WDM routing network, though the laser may be characterized for operation with a single output WDD in a similar manner. The outputs of the various separated wavelength channels are measured by means of power measuring devices 100. The outputs from each measurement device are input to the computer 122, and are stored as a function of each corresponding reflector current.

The power at the desired WDD output is recorded, according to this preferred method, for a specific reflector current. The reflector current is then changed to a different level, and the new power at that output is recorded. A curve of the type shown in FIG. 9 is thus obtained for each separate wavelength output channel of the WDD. For every step observed in the power of each WDD output channel, the center of the step is recorded. A best fit of the assumed response curve of the WDD through the recorded center points of each WDD output channel is then obtained, as explained in the description of FIG. 10A above. If a parabolic response curve is assumed, then the power outputs are fitted to a curve of the form:

$$P = a + bI + cI^2$$

where P is the transmitted power at the output of the WDD, I is the reflector current, and a, b and c are the parabola parameters. The centers of the measured steps are used as three solutions of this equation, and the values of a, b and c thus determined. In this way, the center of the WDD passband of each channel is determined as a function of the laser reflector current.

After tuning the reflector to the desired WDD channel peak, the phase current is in turn changed until the measured power reaches a maximum level, indicating that a Fabry-Perot mode too is centered on the WDD channel passband peak. The currents of both the reflector and the phase sections are then recorded and stored, preferably by means of the computing system 122 and a memory unit 124.

As an outcome of the above procedure according to this preferred embodiment method of the present invention, the operating conditions of the laser are thus optimized to the peak of each of the output channels of the WDD and accordingly to each of the output wavelengths of the WDD into which the laser is feeding without the need to characterize any other areas of operation of the laser, which are generally of no interest to the application for which the laser is currently being used. This "targeted characterization" is thus achieved in a fraction of the time required to perform a characterization by any of the prior art methods.

The above method has been described in terms of the optimization of the laser reflector and phase section currents to the centers of the passbands of the external WDD. In a similar manner, the currents associated with other sections of the laser may be optimized vis-a-vis the external WDD into which the laser is transmitting.

Consequently, in order to tune the laser exactly to the center wavelength of the WDD channel, it is sufficient to determine the current required for centering each section separately and to tune each section sequentially with the required current. By these means, the time required for the complete characterization process for the application in hand can be achieved in a fraction of the time required by prior art methods, and without the collection and recording of any unnecessary data. For each WDD output channel in a complete system, a separate set of tuning currents is determined.

As previously mentioned, a number of alternative and preferred embodiments are feasible using the above mentioned methods and apparatus. The WDD may be a reference device, having a predefined center wavelength, such that the laser can be characterized at that predefined wavelength.

Alternatively and preferably, the WDD may be an array of devices, each with a different wavelength, such as a demultiplexer array, such that the laser may be characterized at a large number of wavelengths, according to those provided by the demultiplexer.

A particularly advantageous preferred embodiment of the present invention is available when the targeted characterization process of the present invention is performed on a laser transmitter operating in a telecommunications system. The optimization can then be performed with minimized disturbance to the system. Reference is thus made to FIG. 12; which schematically illustrates a system utilizing a method, according to a further preferred embodiment of the present invention, of characterizing a laser transmitter, to provide optimum transmission with respect to the installed components of an optical telecommunications channel, right through to the final receiver. In this preferred embodiment, the entire channel constitutes the WDD to whose spectral characteristics, the laser currents are optimized The transmitter laser 130 may be installed in a communication network telecom system, for instance, whose ultimate data destination 131 may be at the remote end of a fiber-optic network link 132, hundreds of miles away. A suitable power monitor 133 in the receiver, which need not necessarily be dedicated for the purposes of the characterization process, provides a measure of the transmitted signal power over the whole of the network channel length, and this data is returned to the transmitter site 130 over a return link 134, which could, of course, be part of the telecom link 132. At the transmitter site, measurement apparatus preferably of the type described in FIG. 11 is installed. The transmitted power data is input to a computing controller unit 135 which adjusts the current source 136 to supply, for instance the transmitter laser's reflector with a current which will optimize the transmission over the whole of the link. Likewise, the currents to other sections of the laser may be optimized to the transmission characteristics in real time, such that the link may be maintained at optimum spectral efficiency, despite changes in the characteristics of components en route.

According to another preferred embodiment of the present invention, this characterization method can be utilized to monitor the ongoing wavelength stability of a system consisting of a laser transmitting into a WDD, where the term WDD can be any of the above-mentioned devices or systems. The output of the WDD is either constantly or repeatedly monitored while the laser is in operation. A drop of any significance in the power transmitted through the WDD is indicative either of a wavelength drift in the laser, or of a shift in the WDD response, the result of either being that the laser is no longer centered on the WDD passband. When this situation is detected, a new characterization needs to be performed of the laser tuning currents, but only vis a vis that WDD, and the laser is then retuned such that it is again centered on that WDD passband, thus maintaining optimum link efficiency. In a similar manner, the optimization can be performed to maintain the laser tuning so that it is accurately aligned to any predetermined position other than the center of the WDD passband. Furthermore, according to another preferred embodiment of the present invention, the monitoring can be performed at regular predefined intervals as part of a routine system maintenance program.

Figure 13A:
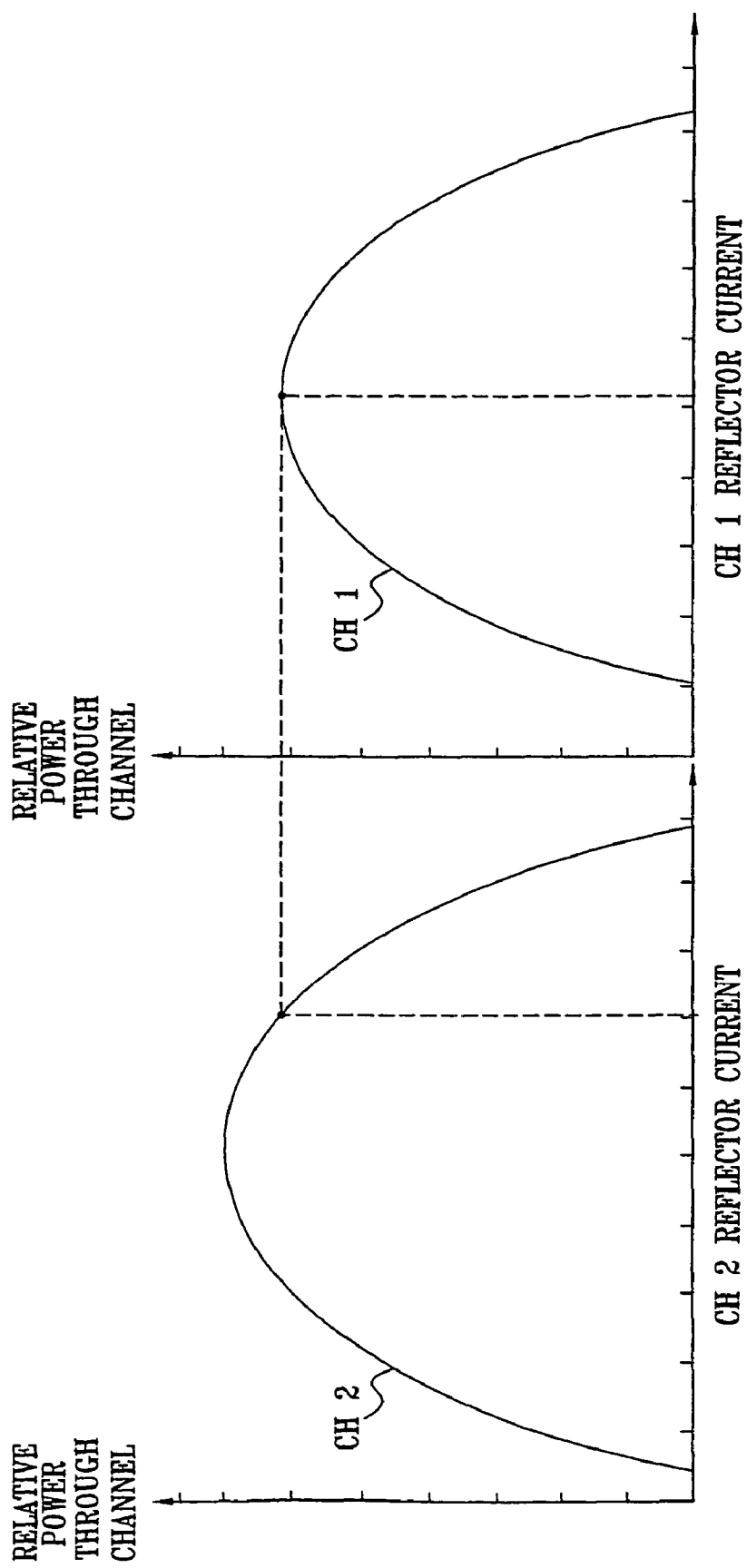
FIG. 13A and FIG. 13B illustrate further preferred embodiments of the methods of the present invention, whereby respectively the power budget of an optical communications channel is optimized, and the interchannel crosstalk is minimized.
Figure 13B:
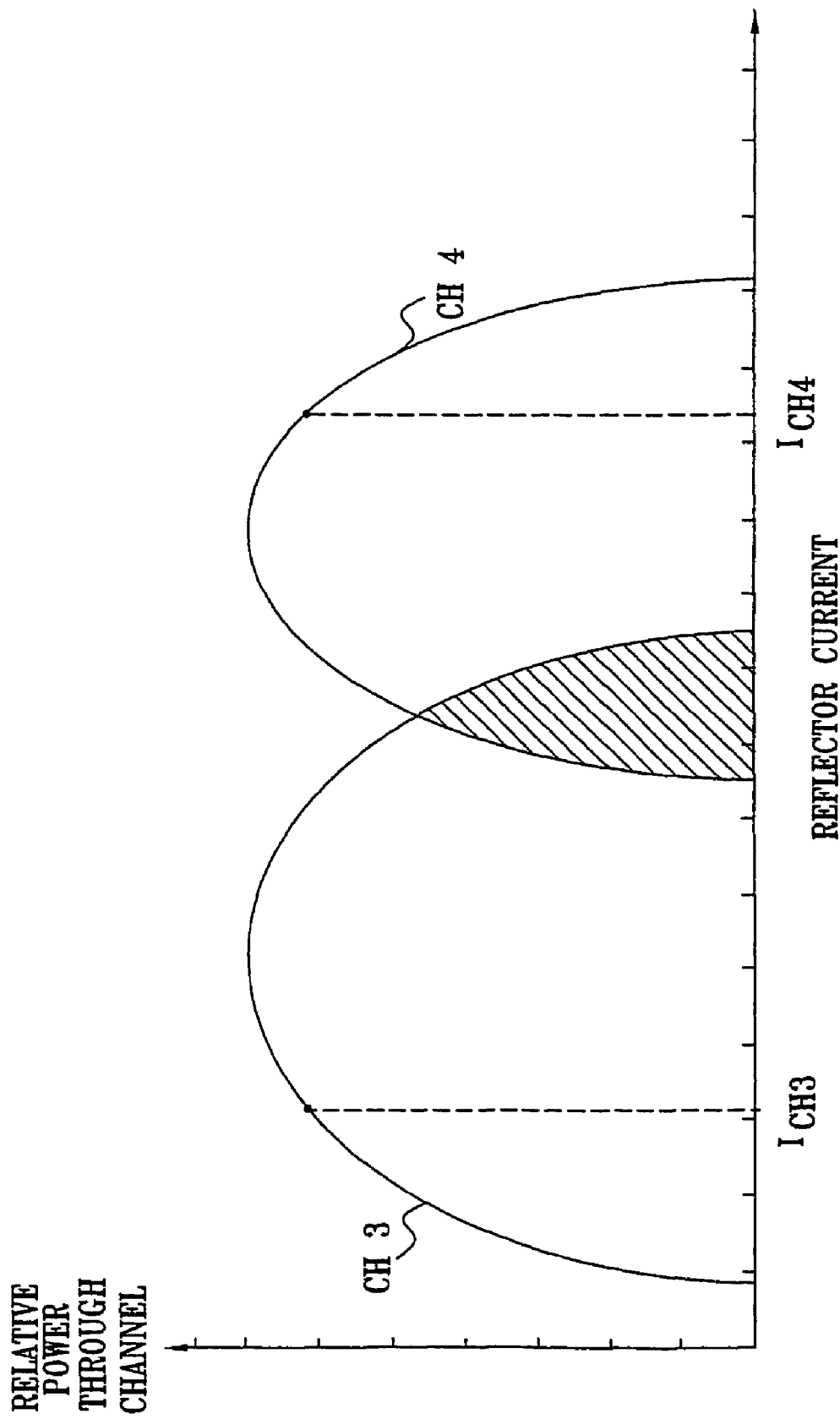

Reference is now made to FIGS. 13A which illustrates a method of optimizing the power budget in an optical communication channel, and to FIG. 13B which illustrates a method of reducing the crosstalk in such a channel, according to further preferred embodiments of the present invention. These two parameters are of importance in ensuring optimum efficiency of an optical communications channel, and the present invention provides fast and convenient preferred methods of optimizing them.

FIG. 13A are plots similar to those shown in FIGS. 10A to 10C, but showing how the response curves of two channels in the communication system are such that the power transmitted through each is different. For optimization of the available power budget, the power at the output of each channel should be at a similar level. In the preferred examples of the two channels shown in FIG. 13A, while the tuning currents of the laser driving channel Ch1 are aligned to center the laser output in the passband of channel Ch1, the tuning currents for channel Ch2 should be adjusted to align the laser off-center of the passband, such that the transmitted power through Ch2 is the same as that through Ch1, thus optimizing power budget. The laser or lasers driving channels Ch1 and Ch2, can be characterized, according to a preferred embodiment of the present invention, such that the laser driving each channel can be aligned to emit at the desired wavelength location relative to each passband, thus optimizing power budget in the system.

FIG. 13B shows the response curves of two adjacent channels Ch3 and Ch4, in a communication system, wherein a problem of crosstalk between them may exist by virtue of their spectral overlap. Crosstalk may be minimized by adjusting the lasers of each channel to emit at wavelengths off-center of the channel passband, such that the wavelengths of each channel are somewhat more distanced from each other, than they would be if the lasers were centered on their respective passbands. According to another preferred embodiment of the present invention, the maintenance of each lasers' optimum respective spectral output relative to the desired spectral position within the response curve of each channel can be readily ensured by a routine characterization of each laser, and readjustment of the relevant section tuning current. Thus, tuning current $I_{Ch3}$ and $I_{Ch4}$ are maintained in their desired off-center positions relative to their channel passbands.

Reference is now made to FIG. 14, which is a schematic wavelength plot of the manner, according to another preferred embodiment of the present invention, whereby an SSG-DBR laser is characterized using modulation to one of the reflectors and/or the phase or gain section, or to any other combination of sections.

The SSG laser has 4 sections: gain, phase, and two SSG reflectors whose peaks 140, 142 have a slightly different pitch. When one of the reflectors (in the embodiment shown in FIG. 13, the front reflector with peaks 140, modulated as shown by arrows 144) and the gain or phase section are modulated (in the embodiment shown in FIG. 13, the gain section), as described in co-pending Israel Patent Application No. 137732 by the present applicant, the laser emits at wavelengths corresponding to peaks 146 of the unmodulated reflector (in the embodiment shown in FIG. 13, the rear reflector). This allows measurement of the tuning characteristics of that unmodulated reflector with respect to the wavelength response of one or more WDD's connected to the output of the laser, by means of the method of the present invention, as described hereinabove. After this process is completed, it is repeated for the other reflector. At this point, both reflector currents are therefore calibrated for each of the WDD's outputs. In order to complete the calibration process, for each WDD output, the reflectors are tuned to the WDD output according to their calibration values, and the phase section current can then be scanned to give peak power at the WDD desired output, so that a Fabry-Perot mode too is centered on the WDD passband.

According to another preferred embodiment of the present invention, the calibrating procedure for the reflector sections can also be performed simultaneously for several WDD outputs, one for each peak of the unmodulated reflector, in one scan of each reflector current.

It will be appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

I claim:

1. A method of characterizing a tunable semiconductor laser diode, comprising the steps of:

passing at least part of the output power of said laser diode through a wavelength discriminating device;

adjusting the tuning current of at least one section of said laser diode;

performing measurements of the transmission of said output power through said wavelength discriminating device as a function of said tuning current;

calculating from said measurements, a tuning current for characterizing said section of said laser diode, said output power as a function of said tuning current having the form of a plurality of steps, said calculating comprising the steps of:

determining the center points of at least two of said steps in said measured output power;

fitting a curve having properties similar to that of the wavelength response of said wavelength discriminating device through said center points of said steps; and determining the tuning current of said section at a predetermined point of said fitted curve.

2. The method of claim 1 and wherein said predetermined point comprises essentially the maximum of said curve.

3. The method of claim 1 and wherein said at least two steps comprises three steps.

4. The method of claim 1 and wherein said fitting of said curve is performed by means of a least squared error optimization.

5. The method of claim 1 and wherein said curve is described by a parabolic form.

6. The method of claim 1, wherein said section is a wavelength selective section of said laser diode.

7. The method of claim 6, wherein said wavelength selective section is a reflector section.

8. The method of claim 6, and also comprising the subsequent step of adjusting the current to a phase section of said laser diode, to optimize said transmission of said output power through said wavelength discriminating device.

9. The method of claim 1, wherein the center wavelength of said wavelength discriminating device is known.

10. The method of claim 1, wherein said wavelength discriminating device is selected from the group consisting of an optical filter, an optical multiplexer, an optical demultiplexer and an optical communication channel.

11. The method of claim 10, and wherein said measurements are utilized to optimize power budget in said optical communication channel.

12. The method of claim 1, and wherein said measurements are utilized to minimize crosstalk between an output of said wavelength discriminating device and a second output of said wavelength discriminating device.

13. The method of claim 1, and wherein said measurements are utilized to optimize transmission of laser power through said wavelength discriminating device.

14. The method of claim 1, and wherein said laser diode is selected from the group consisting of a GCSR laser, an SSG-DBR laser and a DBR laser.

15. The method of claim 1, and wherein the wavelength of said output of said laser diode is unknown.

16. The method of claim 1, and wherein the center wavelength of the passband of said wavelength discriminating device is unknown.

17. A method of characterizing a tunable semiconductor laser diode, comprising the steps of:

passing at least part of the output power of said laser diode through a wavelength discriminating device;

adjusting the tuning current of at least one section of said laser diode;

performing measurements of the transmission of said output power through said wavelength discriminating device as a function of said tuning current;

calculating from said measurements, a tuning current for characterizing said section of said laser diode, said output power as a function of said tuning current having the form of a plurality of steps, said calculating comprising the steps of:

determining the center points of at least two of the edges between said steps in said measured output power;

fitting a curve having properties similar to that of the wavelength response of said wavelength discriminating device through said center points of said edges; and determining the tuning current of said section at a predetermined point of said fitted curve.

18. The method of claim 17 and wherein said predetermined point comprises essentially the maximum of said curve.

19. The method of claim 17 wherein said at least two edges comprises three edges.

20. The method of claim 17 and wherein said fitting of said curve is performed by means of a least squared error optimization.

21. The method of claim 17 and wherein said curve is described by a parabolic form.

22. The method of claim 17, wherein said section is a wavelength selective section of said laser diode.

23. The method of claim 22, wherein said wavelength selective section is a reflector section.

24. The method of claim 22, and also comprising the subsequent step of adjusting the current to a phase section of said laser diode, to optimize said transmission of said output power through said wavelength discriminating device.

25. The method of claim 17, wherein the center wavelength of said wavelength discriminating device is known.

26. The method of claim 17, wherein said wavelength discriminating device is selected from the group consisting of an optical filter, an optical multiplexer, an optical demultiplexer and an optical communication channel.

27. The method of claim 26, and wherein said measurements are utilized to optimize power budget in said optical communication channel.

28. The method of claim 17, and wherein said measurements are utilized to minimize crosstalk between an output of said wavelength discriminating device and a second output of said wavelength discriminating device.

29. The method of claim 17, and wherein said measurements are utilized to optimize transmission of laser power through said wavelength discriminating device.

30. The method of claim 17 and wherein said laser diode is selected from the group consisting of a GCSR laser, an SSG-DBR laser and a DBR laser.

31. The method of claim 17 and wherein the wavelength of said output of said laser diode is unknown.

32. The method of claim 17 and wherein the center wavelength of the passband of said wavelength discriminating device is unknown.

* * * * *